(12) United States Patent
Sprayberry et al.

(10) Patent No.: US 6,383,822 B1
(45) Date of Patent: May 7, 2002

(54) METHODOLOGY FOR TESTING AND QUALIFYING AN INTEGRATED CIRCUIT BY MEASURING AN OPERATING FREQUENCY AS A FUNCTION OF ADJUSTED TIMING EDGES

(75) Inventors: Michael W. Sprayberry; Leland F. Rusk, both of Austin, TX (US)

(73) Assignee: Advanced Micro Devices, Austin, TX (US)

( * ) Notice: Subject to any disclaimer, the term of this patent is extended or adjusted under 35 U.S.C. 154(b) by 0 days.

(21) Appl. No.: 09/539,099

(22) Filed: Mar. 30, 2000

(51) Int. Cl.$^7$ ............................. G01R 31/26; H01L 21/66
(52) U.S. Cl. ............................ 438/11; 438/18; 324/765
(58) Field of Search .............................. 438/10, 11, 12, 438/5, 17, 18; 324/763, 765

(56) References Cited

U.S. PATENT DOCUMENTS 5,818,250 A * 10/1998 Yeung et al.
6,057,699 A * 5/2000 Yin et al.
6,124,143 A * 9/2000 Sugasawara
6,275,057 B1 * 8/2001 Takizawa

OTHER PUBLICATIONS

Wood, T.J., "The Test and Debug Features of the AMD–K7 Microprocessor", 1999 IEEE ITC International Test Conference, paper 6.1, pp. 130–136.*

* cited by examiner

*Primary Examiner*—Michael J. Sherry
*Assistant Examiner*—Evan Pert
(74) *Attorney, Agent, or Firm*—Kelly K. Kordzik; Winstead Sechrest & Minick P.C.

(57) ABSTRACT

A testing methodology for increasing the performance and reliability of integrated circuits ("chips") outputted from a manufacturing process, utilizes a method by which the operating frequency of the integrated circuit is measured when the Self-Timed Pulse Control parameter is adjusted to provide a more strict test upon the chip. Under this more stringent test, the integrated circuits that do not pass the test then are designated as failures or marketed with listed lower operating frequencies.

11 Claims, 3 Drawing Sheets

METHODOLOGY FOR TESTING AND QUALIFYING AN INTEGRATED CIRCUIT BY MEASURING AN OPERATING FREQUENCY AS A FUNCTION OF ADJUSTED TIMING EDGES

TECHNICAL FIELD

The present invention relates in general to the manufacture of integrated circuits, and in particular, to a method for testing the quality of integrated circuits during manufacturing.

BACKGROUND INFORMATION

As is well known, the manufacture of integrated circuits ("chips") is a very expensive process and complicated process. There are numerous ways that a particular chip can be manufactured to have one or more defects, which will degrade the performance of the chip during operations. As such chips proliferate our every day world more and more, it is becoming increasingly imperative that such chips be manufactured with the highest degree of quality.

Various tests are performed on such chips during their manufacturing process, which are used to detect defects and/or predict their potential performance in the field. Such testing methodologies are extremely important in insuring that such parameters as the die-to-ship yield is increased and the parts per million ppm failure rate is minimized.

SUMMARY OF THE INVENTION

The foregoing need is addressed by the present invention, which provides a method to increasing the die-to-ship yield and reducing the parts per million failure rate of chips during their manufacture processes. More specifically, during selected stages of the chip manufacturing process, a test is performed on each of the chips that monitors the chips operating frequency as a function of the selection of a self-timed pulse control ("STPC") parameter. In an embodiment of the present invention, such frequency measurements are performed on the chips after the STPC parameter has been lowered. This results in the removal of marginal chips from the chip lot in greater numbers than when such frequency measurements are performed at a higher STPC parameter.

An advantage of the present invention is that as a result of the more stringent test requirements, the die-to-ship yield is significantly increased. Not only does this increase customer satisfaction as a result of the increased quality of the shipped chips, but it also saves considerable time and money in insuring that fewer bad chips are packaged.

The foregoing has outlined rather broadly the features and technical advantages of the present invention in order that the detailed description of the invention that follows may be better understood. Additional features and advantages of the invention will be described hereinafter which form the subject of the claims of the invention.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

Figure 1:
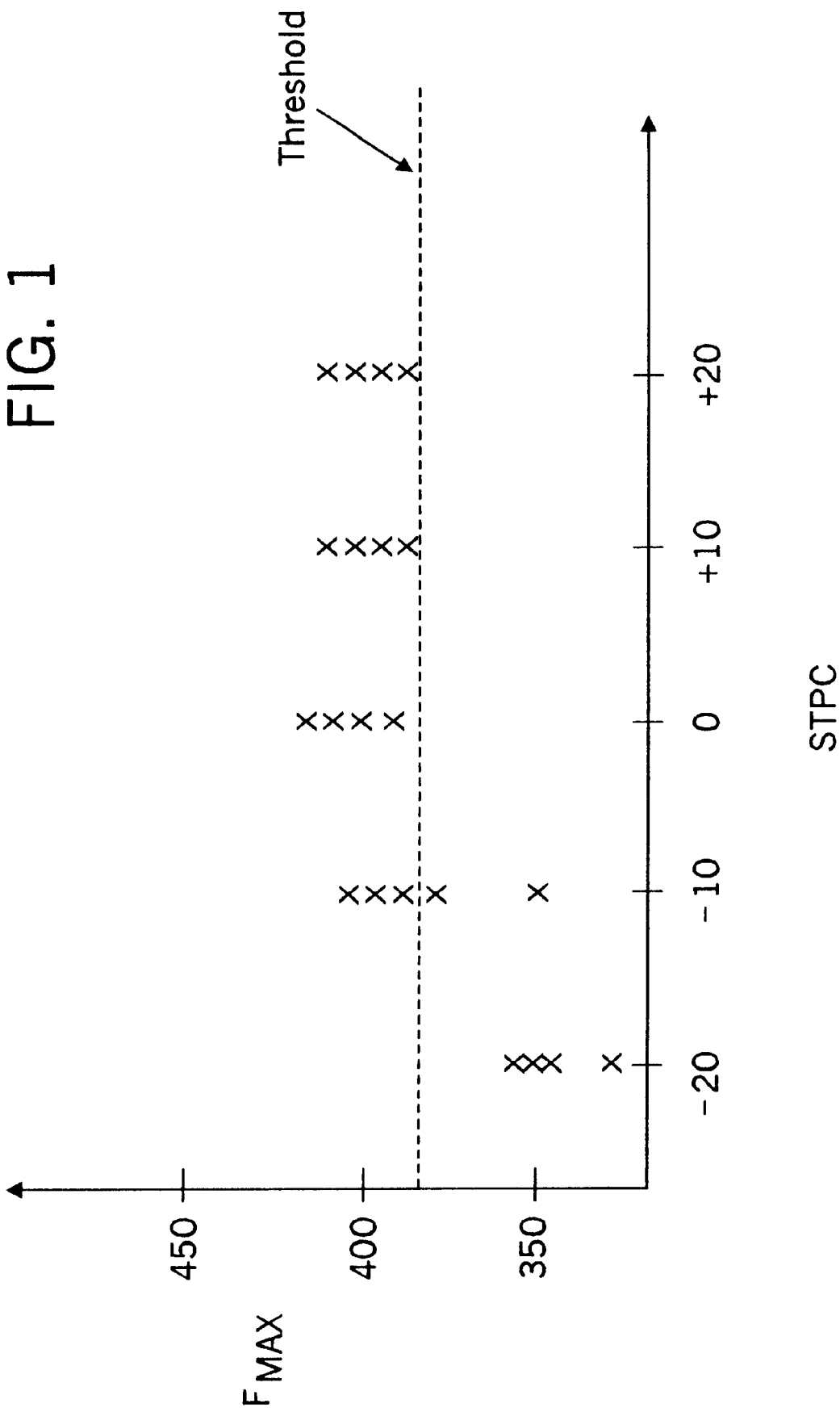
FIG. 1 illustrates a graph of frequency versus STPC, which further denotes a predetermined threshold level for determining whether a particular chip passes or fails a test for measuring the operating frequency of a chip.

In the following description, numerous specific details are set forth to provide a thorough understanding of the present invention. However, it will be obvious to those skilled in the art that the present invention may be practiced without such specific details. In other instances, well-known circuits have been shown in block diagram form in order not to obscure the present invention in unnecessary detail. For the most part, details concerning timing considerations and the like have been omitted in as much as such details are not necessary to obtain a complete understanding of the present invention and are within the skills of persons of ordinary skill in the relevant art.

Refer now to the drawings wherein depicted elements are not necessarily shown to scale and wherein like or similar elements are designated by the same reference numeral through the several views.

Figure 2:
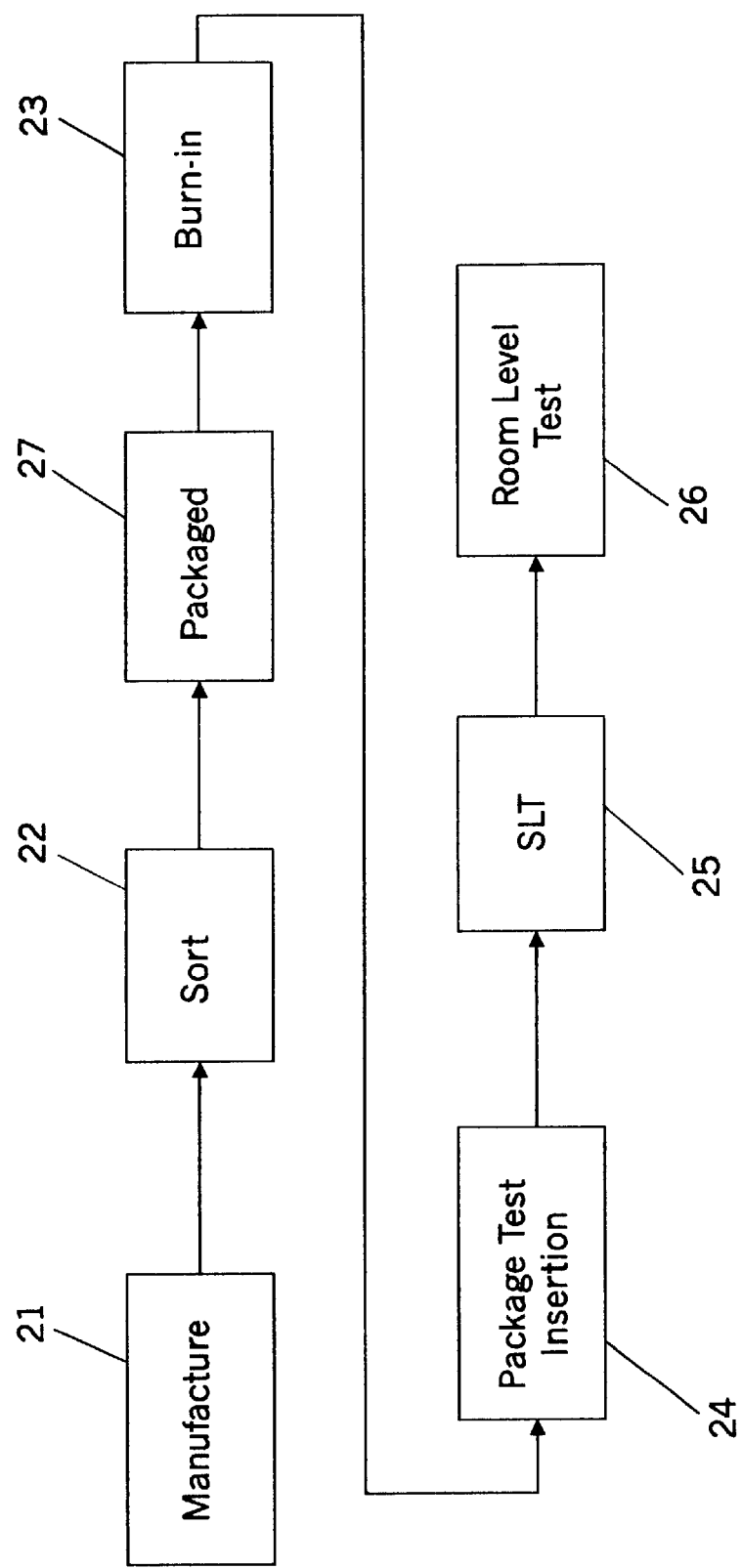
FIG. 2 illustrates a chip manufacturing process in which the testing methodology of the present invention is implemented.

Integrated circuits ("chips") can embody an almost infinite body of chip architectures, including microprocessor chips, micro controller chips, and other chips specially manufactured for particular implementations. Regardless, such chips go through one of various manufacturing processes, such as the one illustrated in FIG. 2. In step 21, a wafer of silicon is run through a series of manufacturing processes to produce a multiple of chips on the wafer. In manufacturing step 22, the individual chips on a wafer are run through one or more tests. As a result of such tests, one of which is the STPC test described below, each chip on the die is designated as passing or failing, and a chip test map is created to accompany that wafer, which identifies which chips passed and which chips failed. At this point, the chips may be cut from the respective wafer and packaged in step 27. In step 23, a burn-in test may be performed whereby the chips are aged using a typical burn-in process at increased temperatures. For example, the devices may be placed in an oven at 130° C., and looped on a built in self test ("BIST") pattern at 2.4 volts for 24 hours. In step 24, a package test insertion is performed whereby the chips are inserted into a test package and tested at higher temperatures. For example, the devices may be run through a handler at 75° C., wherein multiple tests are run on the devices to guarantee that all AC/DC specifications are met, and that static Idd, leakage, dynamic Idd, BIST, ATPG, and functional fault coverage speed tests are performed at both minimum and maximum Vdd specifications. In step 25, a test is performed whereby the chip is plugged into a motherboard and application software is performed thereon. In step 26, room temperature tests on the chips are performed. For example, many of the same tests as performed in step 24 can be performed at 25° C.

What has occurred is that the die-to-ship yield has been unsatisfactory. Even further, when the system level test is performed in Step 25, chips that were manufactured to operate at a certain frequency, (e.g. 400 megahertz), have graded out at much lower frequencies, thus making them unsatisfactory for the uses for which they were designed, even though such chips passed all of the previous tests performed, during one or more of steps 22–24.

Referring to FIG. 1, there is illustrated a sample graph of frequency measurements ($F_{MAX}$) as a function of a Self-Timed Pulse Control (STPC) value.

STPC is used for controlling critical edges in the dynamic portions of chip macros. STPC is controlled through JTAG registers, allowing critical timing edges to be adjusted internally during test modes, but controlled externally. Each edge to be adjusted uses a plurality of bits of STPC that originate from the JTAG registers located in the periphery of the chip. These bits are decoded inside the macro and are used to control delay elements that affect the timing of the critical signal. Essentially, the critical timing edges can be adjusted to increase or decrease them, generally in increments of picoseconds. This is illustrated in FIG. 1, whereby the STPC is used to adjust the critical timing edges in −20, −10, zero, +10 and +20 picosecond increments. Naturally, the present invention should not be limited to such specific increments.

As shown in an example illustrated by FIG. 1, when the STPC is at the nominal zero level, or at the +10 or +20 picoseconds, the measured frequencies of the array tested in the tested chips are within an acceptable range near their designed frequency level of 400 megahertz. Note: each chip is designated by a small "x". However, when the STPC is lowered from the zero level (e.g., the −10 and −20 picosecond levels), the measured frequencies of certain ones of chips in the lot are significantly lower than a range near 400 megahertz. In fact, as the STPC level is lowered into the −10 and −20 picosecond levels, more and more of the chips tested grade out at frequencies much lower than 400 megahertz, such as 350 megahertz. If the chips within that lot were designed to operate at 400 megahertz, these chips will operate unsatisfactorily.

What was performed previously was the measuring of the operating frequency of arrays of the chips at the nominal zero STPC level. All chips that were within a minimum threshold level near 400 megahertz were passed. However, many of these chips that were passed failed during the system level test 25, or during processing of live data by customers.

Figure 3:
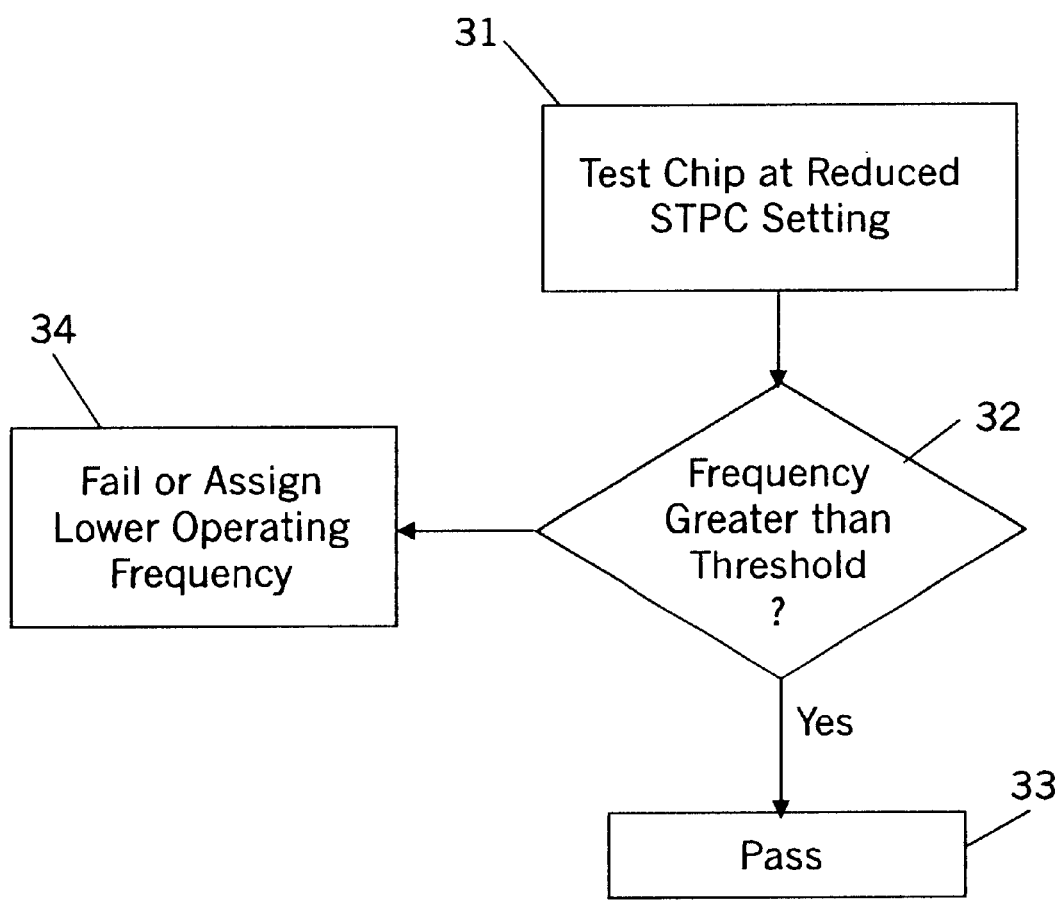
FIG. 3 illustrates a diagram of an implementation of the present invention.

Referring to FIG. 3, the present invention implements a method for testing chips within a lot to increase the die-to-ship yield and lower their parts per million failure rate. In step 31, each chip's frequency is measured at an STPC setting that is lower than the previously utilized zero nominal level. As an example, all chips within a lot may be tested at an STPC setting of −10 (See FIG. 1). In step 32, for each chip, it is determined whether the measured frequency is greater than a threshold frequency level predesignated by the testing administrator. If yes, then in step 33, the chip passes those tests. If not, then in step 34, the chip is discarded as being a failure, or is possibly assigned a lower operating frequency (e.g. 350 megahertz), and is sold as having an operating frequency at that level.

The result of this process is that there is an increase in the number of chips that would have marginally passed the testing when the STPC setting was at the zero level, being failed, which results in the lot of chips that have passed to consist of chips with fewer defects. This results in an increase in the die-to-ship yield and the lowering of parts per million failure rate.

Although the present invention and its advantages have been described in detail, it should be understood that various changes, substitutions and alterations can be made herein without departing from the spirit and scope of the invention as defined by the appended claims.

What is claimed is:

1. A method for testing an integrated circuit ("chip"), comprising the steps of:
    adjusting critical timing edges in a selected macro within the chip,
    measuring an operating frequency of the chip as a function of the adjusted critical timing edges, and
    passing or failing the chip as a function of the measured operating frequency.
2. The method as recited in claim 1, wherein the adjusting step further comprises the step of:
    reducing a self-timed pulse control value that controls the critical timing edges.
3. The method as recited in claim 2, wherein the passing or failing step further comprises the step of:
    failing the chip if the measured operating frequency is below a preselected threshold level.
4. The method as recited in claim 2, wherein the passing or failing step further comprises the step of:
    passing the chip if the measured operating frequency is above a preselected threshold level.
5. The method as recited in claim 2, wherein the passing or failing step further comprises the step of:
    rating the chip at a lower operating frequency if the measured operating frequency is below a preselected threshold level.
6. The method as recited in claim 2, wherein the steps are performed during a manufacturing stage of the chip.
7. A method for manufacturing an integrated circuit ("chip"), comprising the steps of:
    performing manufacturing processes on a wafer containing the chip;
    adjusting critical timing edges in a selected macro within the chip;
    measuring an operating frequency of the chip as a function of the adjusted critical timing edges; and
    passing or failing the chip as a function of the measured operating frequency.
8. The method as recited in claim 7, wherein the adjusting step further comprises the step of:
    reducing a self-timed pulse control value that controls the critical timing edges.
9. The method as recited in claim 8, wherein the passing or failing step further comprises the step of:
    failing the chip if the measured operating frequency is below a preselected threshold level.
10. The method as recited in claim 8, wherein the passing or failing step further comprises the step of
    passing the chip if the measured operating frequency is above a preselected threshold level.
11. The method as recited in claim 8, wherein the passing or failing step further comprises the step of:
    rating the chip at a lower operating frequency if the measured operating frequency is below a preselected threshold level.

\* \* \* \* \*

UNITED STATES PATENT AND TRADEMARK OFFICE
CERTIFICATE OF CORRECTION

PATENT NO. : 6,383,822 B1
DATED : May 7, 2002
INVENTOR(S) : Michael W. Sprayberry and Leland F. Rusk It is certified that error appears in the above-identified patent and that said Letters Patent is hereby corrected as shown below:

Column 2,
Line 3, replace "," with -- ; --.
Line 25, replace "micro controller" with -- microcontroller --.
Line 39, replace "bum-in" with -- burn-in --.
Line 41, replace "130ºC.," with -- 130ºC, --.
Line 45, replace "75ºC.," with -- 75ºC, --.

Column 4,
Line 7, replace "," with -- ; --.
Line 9, replace "," with -- ; --.
Line 50, after "of" insert -- ; --.

Signed and Sealed this

Fifth Day of November, 2002

*Attest:*

JAMES E. ROGAN
Director of the United States Patent and Trademark Office

*Attesting Officer*